United States Patent [19]

Sheldon

[11] Patent Number: 5,331,283
[45] Date of Patent: Jul. 19, 1994

[54] APPARATUS FOR DETECTING A COMPLETED ELECTRICAL CIRCUIT AT AN ELECTRICAL OUTPUT RECEPTACLE

[76] Inventor: Alan L. Sheldon, 6341 State Rte. 159, New Athens, Ill. 62264

[21] Appl. No.: 980,329

[22] Filed: Nov. 23, 1992

[51] Int. Cl.$^5$ ............... G01R 31/04; G08B 21/00
[52] U.S. Cl. ............................... 324/508; 324/133; 324/556; 340/656; 439/489
[58] Field of Search ............... 324/133, 508, 555, 556; 439/489, 490, 620; 340/654, 656

[56] References Cited

U.S. PATENT DOCUMENTS

| | | | |
|---|---|---|---|
| 2,484,092 | 10/1949 | Hopgood | 439/620 X |
| 4,725,772 | 2/1988 | Peak | 324/133 X |
| 4,801,868 | 1/1989 | Brooks | 324/508 X |
| 4,945,346 | 7/1990 | Schmiemann | 324/508 X |

Primary Examiner—Gerard R. Strecker
Assistant Examiner—Diep Do
Attorney, Agent, or Firm—S. Michael Bender

[57] ABSTRACT

An electrical test buzzer is adapted for insertion into an output receptacle and used to test for the presence of electricity at the output receptacle. The electrical test buzzer includes an audible alarm, a transformer, held in a housing, and a pair of contact prongs. The contact prongs are inserted into a respective output receptacle causing the buzzer to sound a high pitched alarm when electricity is present at the receptacle. When no electricity is present at the receptacle no circuit is formed and the alarm does not sound.

1 Claim, 4 Drawing Sheets

APPARATUS FOR DETECTING A COMPLETED ELECTRICAL CIRCUIT AT AN ELECTRICAL OUTPUT RECEPTACLE

BACKGROUND OF THE INVENTION

1. Field of the Invention

The present invention relates generally to the testing of output receptacles and, more particularly, to determine whether an output receptacle or bare wires are "live".

2. Description of the Prior Art

Testers for determining whether a wire or output receptacle are well known. For example, U.S. Pat. No. 5,027,074 dated Jun. 25, 1991 discloses a device for testing the individual conductors of a multiconductor cable. Pulses are transmitted through each conductor. These pulses are monitored, processed and displayed. U.S. Pat. No. 4,816,746 dated Mar. 28, 1989 discloses a device which is connected to an existing electrical circuit to determine the presence of power across a pair of conductors. A switch is included to allow an alarm to sound when either power is present or when power is not present. U.S. Pat. No. 4,870,343 dated Sep. 26, 1989 discloses a device for detecting the presence of a high voltage. U.S. Pat. No. 4,734,651 dated Mar. 29, 1988 discloses a device for determining the electrical continuity between the terminals of a multi-contact electrical connector and the cores of insulated leads connected thereto. U.S. Pat. No. 3,514,552 discloses an apparatus for checking the connection of wires within a circuit.

It is frequently desirable to determine if an electrical outlet or loose wires are "live", as in the case of attaching a fixture, without the possibility of injury from attempting to work with such "live" wires. If one attempts to attach a fixture to a set of bare wires there is a strong possibility of electrocution should those wires be "live". A need exists, therefore, for a safe and effective way of determining whether an output receptacle or bare wires are "live" before working with them and for determining which circuit breaker switch is appropriate for turning off the flow of electricity to the receptacle or wires.

The foregoing is accomplished by the unique electrical test buzzer of the present invention as will be made apparent from the following description thereof. Other advantages of the present invention over the prior art also will be rendered evident.

SUMMARY OF THE INVENTION

To achieve the foregoing and other advantages, the present invention, briefly described, provides an electrical test buzzer adapted for insertion into an output receptacle used to test for the presence of electricity at the output receptacle. The electrical test buzzer includes an audible alarm, a transformer held in a housing and a pair of contact prongs. The contact prongs are inserted into a respective output receptacle causing the buzzer to sound a high pitched alarm when electricity is present at the receptacle. When no electricity is present at the receptacle no circuit is formed and the alarm does not sound.

The above brief description sets forth rather broadly the more important features of the present invention in order that the detailed description thereof that follows may be better understood, and in order that the present contributions to the art may be better appreciated. There are, of course, additional features of the invention that will be described hereinafter and which will form the subject matter of the claims appended hereto.

In this respect, before explaining at least two preferred embodiments of the invention in detail, it is to be understood that the invention is not limited in its application to the details of the construction and to the arrangements of the components set forth in the following description or illustrated in the drawings. The invention is capable of other embodiments and of being practiced and carried out in various ways. Also, it is to be understood, that the phraseology and terminology employed herein are for the purpose of description and should not be regarded as limiting.

As such, those skilled in the art will appreciate that the conception, upon which this disclosure is based, may readily be utilized as a basis for designing other structures, methods, and systems for carrying out the several purposes of the present invention. It is important, therefore, that the claims be regarded as including such equivalent constructions insofar as they do not depart from the spirit and scope of the present invention.

Further, the purpose of the foregoing Abstract is to enable the U.S. Patent and Trademark Office and the public generally, and especially the scientists, engineers and practitioners in the art who are not familiar with patent or legal terms of phraseology, to determine quickly from a cursory inspection the nature and essence of the technical disclosure of the application. Accordingly, the Abstract is neither intended to define the invention or the application, which only is measured by the claims, nor is it intended to be limiting as to the scope of the invention in any way.

It is therefore an object of the present invention to provide a new and improved electrical test buzzer which has all of the advantages of the prior art and none of the disadvantages.

It is another object of the present invention to provide a new an improved electrical test buzzer which may be easily and efficiently manufactured and marketed.

It is a further objective of the present invention to provide a new and improved electrical test buzzer which is of durable and reliable construction.

An even further object of the present invention is to provide a new and improved electrical test buzzer which is susceptible of a low cost of manufacture with regard to both materials and labor, and which accordingly is then susceptible of low prices of sale to the consuming public, thereby making such electrical test buzzer available to the buying public.

Still yet a further object of the present invention is to provide a new and improved electrical test buzzer for safely and efficiently determining if certain output receptacles or bare wires are "live".

It is still a further object of the present invention is to provide a new and improved electrical test buzzer for aiding in the removal of electrical flow to "live" output receptacles or bare wires.

Still a further object of the present invention is to provide a new and improved electrical test buzzer for providing an audible alarm when connected to a "live" output receptacle or bare wires.

The above objects are accomplished by a new and improved electrical test buzzer which includes a housing and a buzzer. The housing includes a transformer and a pair of axially extending conductive blade contacts, each of the axially extending conductive blade contacts has a first end connected to the transformer and a second end extending outwardly from said housing, for receipt within an outlet receptacle. The buzzer is connected to the transformer and produces an audible sound when the pair of conductive blade contacts is received by an output receptacle having electricity flowing through it.

The electrical test buzzer may also include a female extension cord plug, alligator clips, and a connection device. The connection device connects the female extension cord plug to the alligator clips. The pair of conductive blade contacts are received by the female extension cord plug. These additional components adapts the buzzer for connection to bare wires. The alligator clips are for connecting the test buzzer to bare wires.

The electrical test buzzer may also be adapted to test a pair of output receptacles at one time. This adaptation would include a second transformer, a second pair of conductive blade contacts and a toggle switch within the housing. The second pair of conductive blade contacts has a first end connected to the second transformer and a second end extending outwardly from the housing and the toggle switch has three settings for connecting the buzzer to one of the transformers. The three positions of the toggle switch include a first position in which the toggle switch forms a connection between the buzzer and the first transformer, a second position in which the toggle switch forms a connection between the buzzer and the second transformer and a third position in which the buzzer is not connected to any of the first and the second transformers.

The electrical test buzzer may also be adapted for operation at a location remote from the device. For such adaptation the device would also include a cable connector, connected between the buzzer and the transformers, extending from a side wall of the housing, a remote toggle switch, a cable and a connector. The remote toggle switch is connected to the housing through the cable and connected by the cable connector and other connector. The remote toggle switch operates identically to the other toggle switch and is inactive until the other toggle switch is in the third or non connection position.

These together with still other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated preferred embodiments of the invention.

BRIEF DESCRIPTION OF THE DRAWINGS

The invention will be better understood and the above objects as well as objects other than those set forth above will become more apparent after a study of the following detailed description thereof. Such description makes reference to the annexed drawings wherein.

DESCRIPTION OF THE PREFERRED EMBODIMENT

With reference now to the drawings, a new and improved electrical test buzzer embodying the principles and concepts of the present invention will be described.

Figure 1:
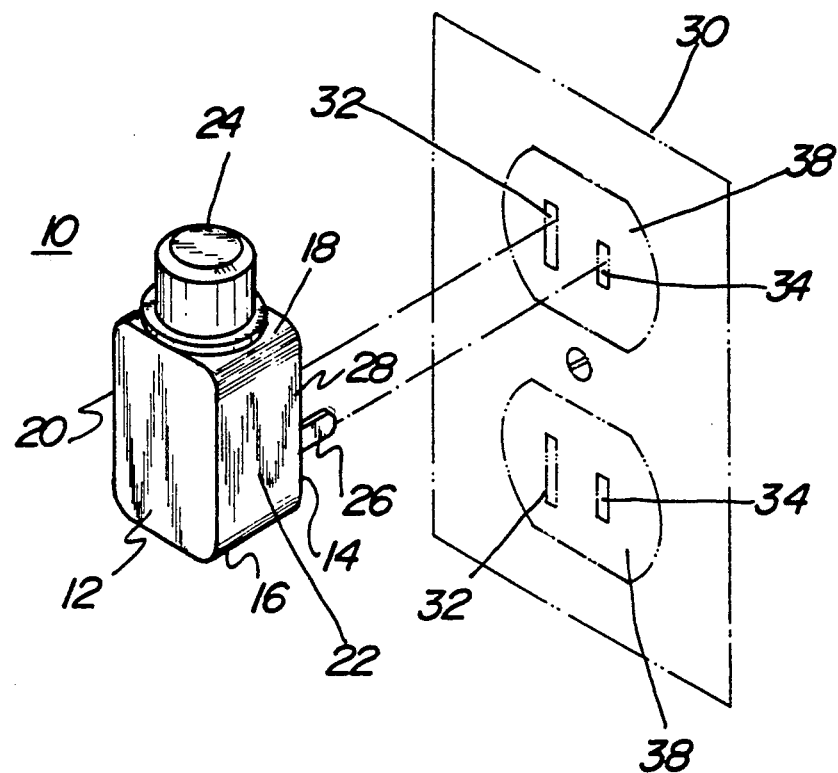
FIG. 1 is a perspective view showing the first preferred embodiment of the electrical test buzzer of the invention.
Figure 2:
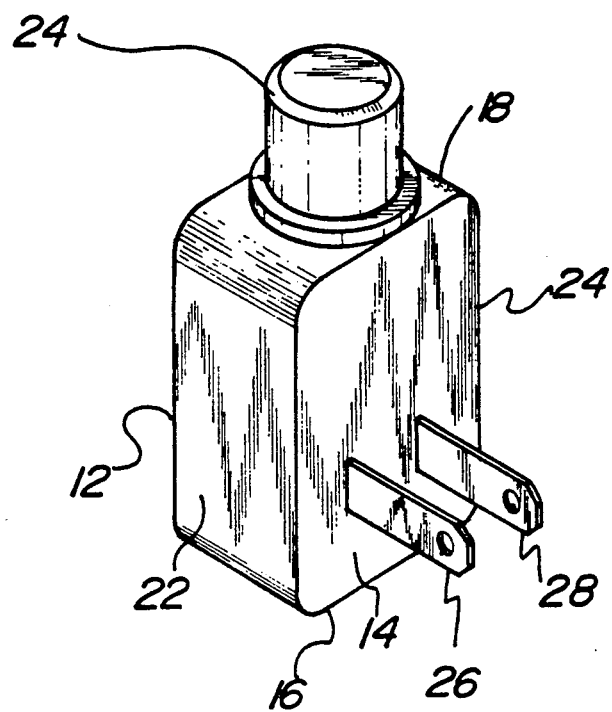
FIG. 2 is a perspective view of the electrical test buzzer of FIG. 1.

Turning initially to FIGS. 1 and 2, there is shown a first exemplary embodiment of the electrical test buzzer of the invention generally designated by reference numeral 10. In its preferred form, electrical test buzzer 10 comprises generally a square shaped housing having front and rear opposed walls 12 and 14; bottom and top opposed walls 16 and 18; and right and left opposed walls 20 and 22. The housing serves as an enclosure for a conventionally known transformer having the usual, well understood input winding and output winding. Such transformers are well known and the details of same form no part of the present invention.

Electrically connected to the output winding of the transformer, enclosed in the housing, and mounted on the top wall 18 is an audible signal device such as a buzzer 24. Extending from the front wall 14 of the housing and electrically connected to the input winding of the transformer are blade contacts or prongs 26 and 28, such as is commonly employed to draw electrical current from a wall socket.

The electrical test buzzer is used in connection with conventional wall mounted electrical sockets or outlet receptacles designated generally by reference numeral 30 in a manner believed apparent from the above description. Each receptacle has at least two suitable openings 32 and 34 for receiving respective blade contacts 26 and 28.

Figure 3:
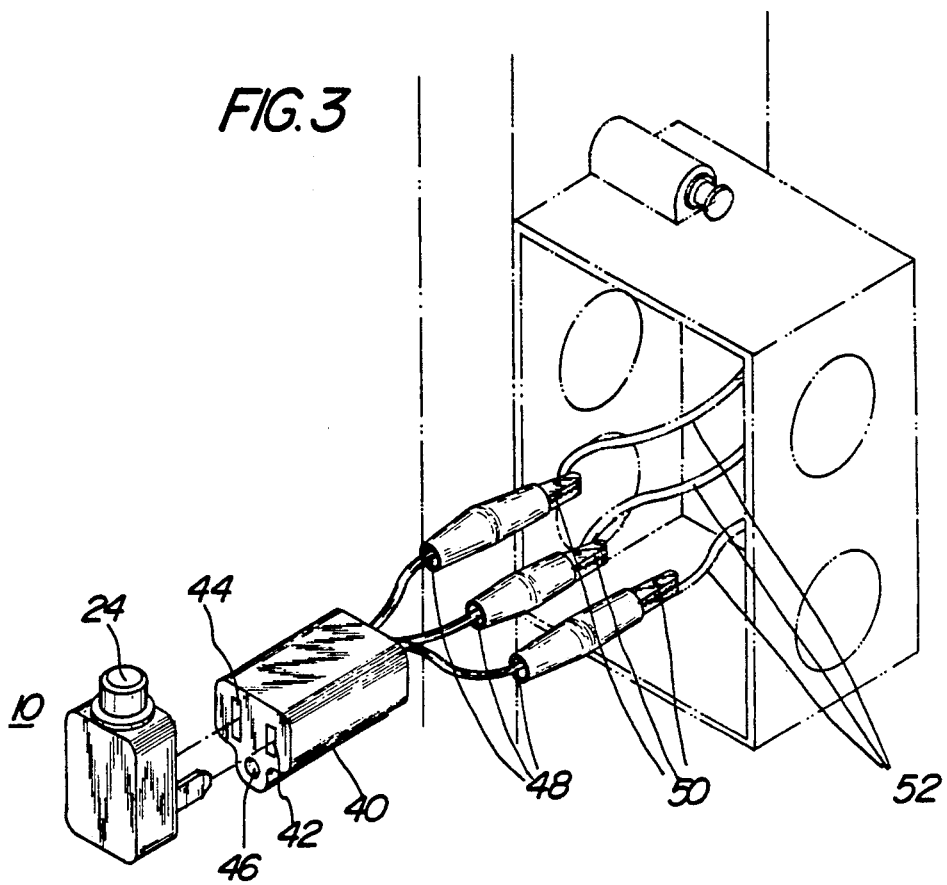
FIG. 3 is a perspective view of the electrical test buzzer of FIG. 2 adapted for attachment to bare wires.

FIG. 3 illustrates the electrical test circuit of FIGS. 1 and 2 including a female extension cord plug 40, electrical connecting wires 48 and alligator clips 50. The female extension cord plug 40 is connected to the alligator clips 50 through the electrical connecting wires 48. The female extension cord plug 40 has suitable openings 42 and 44 for receiving the blade contact prongs 26 and 28 of the transformer housing 20. In addition, the female extension cord plug has a suitable opening 46 for a ground prong. The electrical connecting wires 48 are electrically connected between the female extension cord plug 40 and the alligator clips 50 to form an electrical connection between the three openings 42, 44 and 46 and the alligator clips 50 when the alligator clips 50 are connected to bare wires 52. The alligator clips 50 are to be clipped to bare wires 52 in places where a suitable outlet receptacle is not present. When the prongs 26 and 28 are received by the female extension cord plug 40 and the alligator clips 50 are clipped to respective wires 52, a circuit is formed and the electrical test buzzer 10 is operational.

Figure 4:
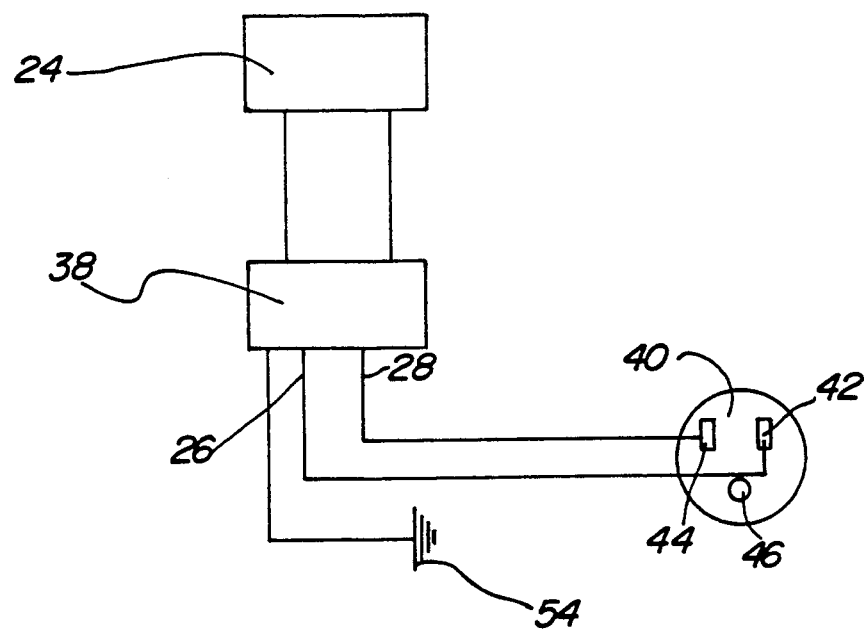
FIG. 4 is a circuit diagram of the preferred embodiment of the invention.

FIG. 4 is a block diagram of the circuit formed when the electrical test buzzer 10 is received in an outlet receptacle. The buzzer 24 is connected to the transformer 38. The prongs 26 and 28, attached to the transformer, are received by respective openings 42 and 44 of an output receptacle 40 thus forming an electrical circuit. The transformer 38 also has a third connection to ground 54.

Figure 5:
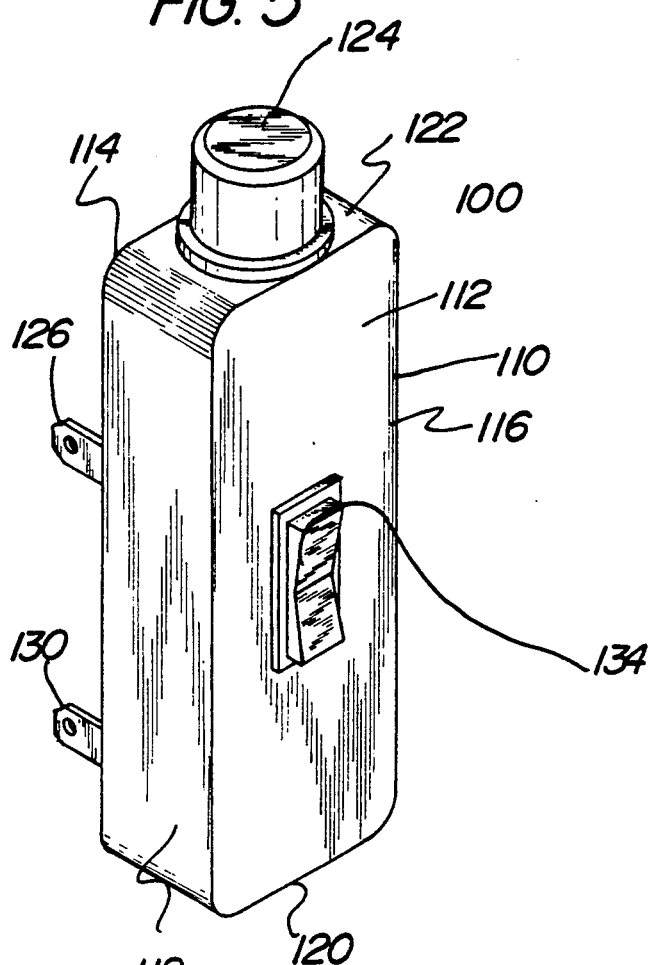
FIG. 5 is a perspective view of a second preferred embodiment of the invention.
Figure 6:
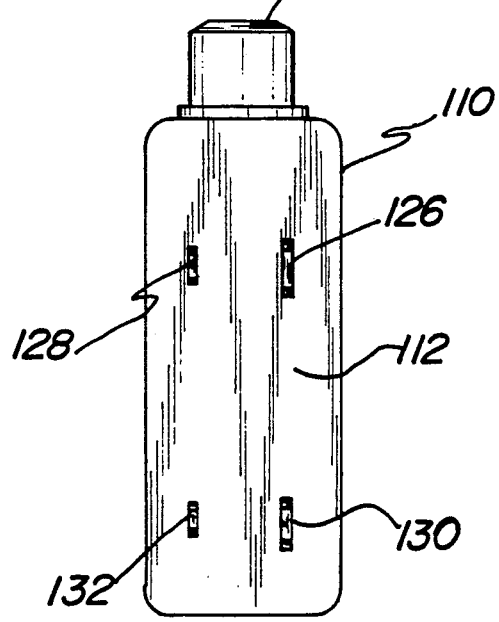
FIG. 6 is a perspective view of the electrical test buzzer of FIG. 5.
Figure 7:
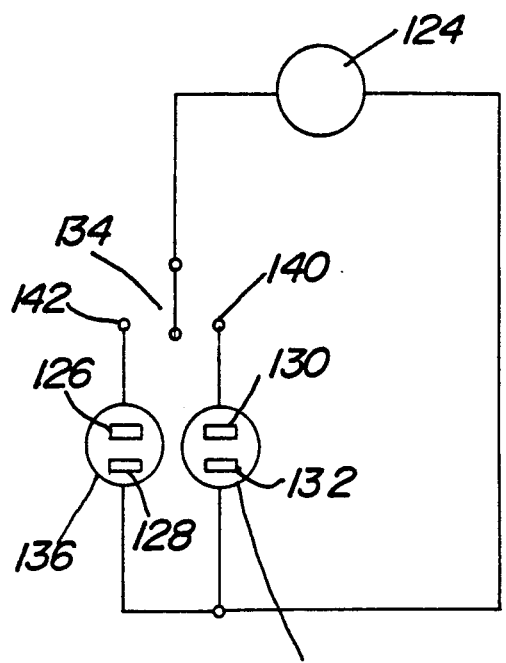
FIG. 7 is a circuit diagram of the electrical test buzzer of FIGS. 5 and 6.

Another embodiment of the present invention is illustrated in FIGS. 5-7. The embodiment of the electrical test buzzer is designated by reference numeral 100. In its preferred form, the electrical test buzzer generally comprises a rectangular shaped housing 110 having front and rear opposed walls 112 and 114; right and left opposed sides 116 and 118; and bottom and top opposed walls 120 and 122. The housing 110 serves as an enclosure for a pair of transformers 136 and 138. Each transformer 136 and 138 is electrically connected to a pair of blade contacts or prongs, 126 and 128, and 130 and 132 respectively. Mounted on the top wall 122 of the housing 110 is a buzzer 124. Electrically connected between the buzzer 124 and the two transformers 136 and 138 is a three way toggle switch 134. The toggle switch 134 has three settings forming different combinations of connections between the buzzer 124 and the two transformers 136 and 138. The first setting forms a connection between the transformer represented by number 136 and the buzzer 124. The second setting forms a connection between the transformer represented by number 138 and the buzzer 124. The third setting represents an off position in which the buzzer 124 is not connected to either transformer 136 or 138.

FIG. 7 shows an electrical circuit diagram of the electrical test buzzer 100 with the toggle switch 134 in the off position. The toggle switch 134 can be switched to make contact with either lead 142 or lead 144. If the switch 134 is toggled to make contact with lead 142 a connection between the buzzer 124 and transformer 136 is formed. If the switch 134 is toggled to make contact with lead 140 then a connection is made between buzzer 134 and transformer 138.

Figure 8:
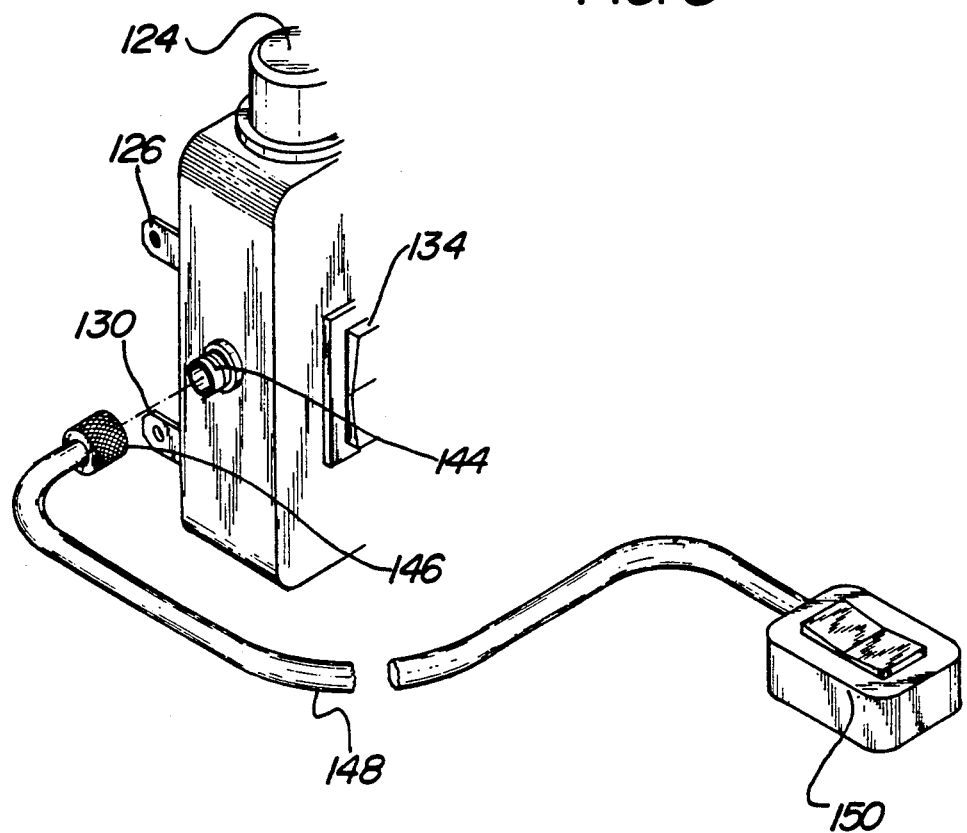
FIG. 8 is perspective view of the electrical test circuit of FIG. 5 including a remote toggle switch.
Figure 9:
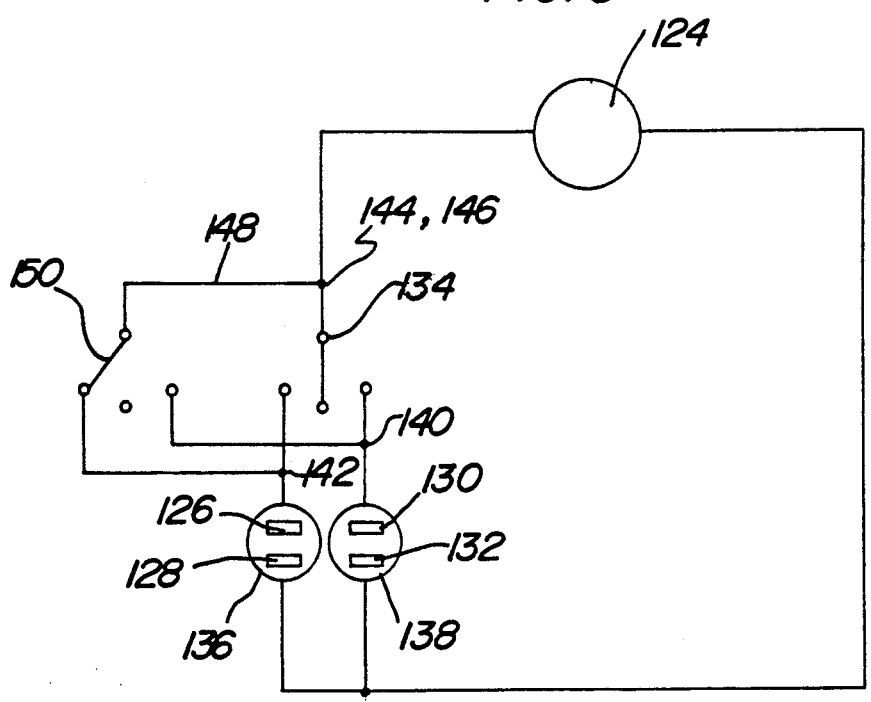
FIG. 9 is a circuit diagram of the electrical test buzzer of FIG. 8.

FIGS. 8 and 9 illustrate the electrical test buzzer of FIGS. 5-7 including a cable connector 144 to attach a remote toggle switch 146 to the electrical test buzzer. The cable connector 144 is connected to the buzzer 124 in the same manner as the toggle switch 134. A remote toggle switch 150 is connected to the cable connector 144 through a screw on end 146 and a cable 148. The remote toggle switch 150 is activated upon connection to the cable connector 144 and toggling of the toggle switch 134 into the off position. The remote toggle switch 150 operates in the same manner as toggle switch 134 having identical settings but allows for testing an output receptacle from a remote position.

In operation, the electrical test buzzer of FIG. 1 is plugged into an outlet receptacle to form a closed circuit. Upon insertion into the receptacle the buzzer gives off a high pitched sound which can be heard at great distances if the receptacle is "live". When using the embodiment of FIGS. 3 and 4 the alligator clips are clipped to the respective bare wires producing the same result.

An output receptacle having a pair of electrical contact receptacles is needed for use of the embodiments of FIGS. 5-9. This embodiment is adapted to test each receptacle without the need to remove the electrical test buzzer from the receptacle. This is accomplished by toggling the switch. Thus, the appropriate connection can be made between the buzzer and one of the transformers to test the desired receptacle. The remote toggle switch allows testing of the receptacle from a great distance. Operation of this embodiment is equivalent to a test buzzer having a single pair of prongs, as described above. An audible sound is given off by the buzzer when the transformer being connected to the buzzer is received by a "live" output receptacle.

The electrical buzzer of the present invention is appropriate for testing outlets and wiring for single pole and 3-way switches before installing fixtures. It is also appropriate for testing whether a receptacle is "live" and removing the flow of electricity from the receptacle at a circuit breaker panel. By using the remote toggle switch, a user can find the correct breaker switch for each outlet receptacle to which the buzzer is connected without having to return to the receptacle. This is done by removing fuses or turning off the breaker until the electrical circuit formed by the test buzzer is broken and the high pitched sound turns off. The user can then toggle the switch at the remote location to test the next receptacle. Thus, the user need not be at a position near the receptacle but only as close to the receptacle as is necessary to hear the buzzer.

It is apparent from the above that the present invention accomplishes all of the objectives set forth by providing a new and improved electrical test buzzer which may be easily and efficiently manufactured and marketed, is of durable and reliable construction, is susceptible of a low cost of manufacture with regard to both materials and labor, safely and efficiently determines if certain output receptacles or bare wires are "live", aids in the removal of electrical flow to "live" output receptacles or bare wires, and provides an audible alarm when connected to a "live" output receptacle or bare wires.

With respect to the above description, it should be realized that the optimum dimensional relationships for the parts of the invention, to include variations in size, materials, shape, form, function and manner of operation, assembly and use, are deemed readily apparent and obvious to those skilled in the art, and therefore, all relationships equivalent to those illustrated in the drawings and described in the specification are intended to be encompassed only by the scope of appended claims.

While the present invention has been shown in the drawings and fully described above with particularity and detail in connection with what is presently deemed to be the most practical and preferred embodiment(s) of the invention, it will be apparent to those of ordinary skill in the art that many modifications thereof may be made without departing from the principles and concepts set forth herein. Hence, the proper scope of the present invention should be determined only by the broadest interpretation of the appended claims so as encompass all such modifications and equivalents.

What is claimed as being new and desired to be protected by Letters Patent of the United States is as follows:

1. Apparatus for detecting the presence of a completed electrical circuit at an electrical outlet receptacle comprising:
   a housing, said housing having
      at least one transformer having an input winding and an output winding; and
      at least one pair of axially extending conductive blade contacts, each of said at least one pair of axially extending conductive blade contacts having a first end connected to said input winding of said at least one transformer and a second end extending outwardly from said housing; and audible signal means connected to said output winding of said at least one transformer, for producing an audible sound when said at least one pair of conductive blade contacts is received by an output receptacle and electricity is flowing through said output receptacle, wherein said housing further comprises:

a second transformer having an input winding and an output winding;

a second pair of conductive blade contacts, each of said second pair of conductive blade contacts having a first end connected to the input winding of said second transformer and a second end extending outwardly from said housing; and first toggle switch means for connecting the audible signal means alternately to the output windings of said first and second transformers upon actuation of said toggle switch means, wherein the first toggle switch means has three positions, a first position in which the first toggle switch means forms a connection between said audible signal means and said output winding of said first transformer, a second position in which the toggle switch means forms a connection between the audible signal means and said output winding of said second transformer and a third position in which said audible signal means is not connected to either said output winding of said first and second transformers, wherein said housing further includes a cable connection means extending from said housing and an electrical cable having first and second ends, said first end of said cable adapted to be connected to said housing cable connection means, said housing cable connection means being connected to said first toggle switch means, and said second end of said cable being connected to second toggle switch means whereby said second toggle switch means is adapted to be located at a location remote from said housing, and wherein said second toggle switch means has three positions corresponding to said three positions of said first toggle switch means such that actuation of said second toggle switch means is effective to actuate said first toggle switch means to a corresponding position from said remote location.

* * * * *